(12) United States Patent
Watt et al.

(10) Patent No.: US 7,612,410 B1
(45) Date of Patent: Nov. 3, 2009

(54) TRIGGER DEVICE FOR ESD PROTECTION CIRCUIT

(75) Inventors: Jeffrey Watt, Palo Alto, CA (US); Irfan Rahim, San Jose, CA (US)

(73) Assignee: Altera Corporation, San Jose, CA (US)

( * ) Notice: Subject to any disclaimer, the term of this patent is extended or adjusted under 35 U.S.C. 154(b) by 27 days.

(21) Appl. No.: 11/199,614

(22) Filed: Aug. 8, 2005

(51) Int. Cl.
*H01L 29/861* (2006.01)

(52) U.S. Cl. ............................... 257/356; 257/E29.328

(58) Field of Classification Search .................. 257/356
See application file for complete search history.

(56) References Cited

U.S. PATENT DOCUMENTS

| | | | | |
|---|---|---|---|---|
| 6,015,993 | A * | 1/2000 | Voldman et al. | 257/355 |
| 6,353,245 | B1 * | 3/2002 | Unnikrishnan | 257/347 |
| 6,822,297 | B2 * | 11/2004 | Nandakumar et al. | 257/356 |
| 6,967,363 | B1 * | 11/2005 | Buller | 257/288 |
| 2002/0109153 | A1 * | 8/2002 | Ker et al. | 257/199 |
| 2002/0149058 | A1 * | 10/2002 | Culp et al. | 257/354 |
| 2002/0153571 | A1 * | 10/2002 | Mergens et al. | 257/358 |
| 2003/0025159 | A1 * | 2/2003 | Hogyoku | 257/347 |
| 2005/0035410 | A1 * | 2/2005 | Yeo et al. | 257/355 |

* cited by examiner

*Primary Examiner*—Sue Purvis
*Assistant Examiner*—Benjamin P Sandvik
(74) *Attorney, Agent, or Firm*—Ward & Olivo LLP

(57) ABSTRACT

The present invention is a trigger device useful, for example, in triggering an SCR in an ESD protection circuit. Illustratively, an NMOS trigger device comprises a gate and heavily doped P and N regions in a P-well on opposite sides of the gate. A first N type source/drain extension and a first P-type pocket region extend from the P region toward the N region with the pocket region located under the source/drain extension and extending under the gate. A second N-type source/drain extension and a second P-type pocket region extend from the N region toward the P region with the pocket region located under the source/drain extension and extending under the gate. Preferably, the gate itself is heavily doped so that one half of the gate on the side adjacent the heavily doped P region is also heavily doped with dopants of P-type conductivity and the other half of the gate on the side adjacent the heavily doped N region is also heavily doped with dopants of N-type conductivity. Doping the gate increases the threshold voltage by about one Volt due to an increase in the work function on the source side of the gate.

13 Claims, 3 Drawing Sheets

TRIGGER DEVICE FOR ESD PROTECTION CIRCUIT

FIELD OF INVENTION

The present invention relates to electronic devices, and more specifically to electrostatic discharge (ESD) protection structures for protecting an integrated circuit from ESD damage.

BACKGROUND OF INVENTION

ESD protection has been a main concern in the reliability of integrated circuit (IC) products in submicron complimentary metal-oxide-silicon (CMOS) technologies. For example, drain diffusion regions in N-type metal-oxide-silicon (NMOS) and P-type metal-oxide silicon (PMOS) transistors in output buffers of a CMOS IC are often directly connected to output pads of the IC in order to drive external loads of the IC, causing the CMOS output buffers to be vulnerable to ESD damage.

Lateral semiconductor-controlled rectifier (SCR) devices have been widely used in ESD-protection structures for input protection in submicrometer CMOS IC's. See R. N. Rountree, et al., "A Process-Tolerant Input Protection Circuit for Advanced CMOS Processes," 1988 EOS/ESD Symposium Proceedings, p. 201. For the output buffers, a low-voltage triggering SCR (LVTSCR) with an inserted NMOS transistor in a lateral SCR structure has been used to provide a much lower trigger voltage than a conventional SCR. As shown in FIG. 1, such a device comprises a PNP transistor 110, an NPN transistor 120 and an NMOS transistor 130 with the base of the PNP transistor connected to the collector of the NPN transistor, the base of the NPN transistor connected to the collector of the PNP transistor and the source and drain of the NMOS transistor connected between the collector and emitter of the PNP transistor. The inserted NMOS transistor in the LVTSCR is designed with its gate grounded to provide a low breakdown voltage for the drain-substrate diode at the gate edge. The low breakdown voltage leads to a low trigger voltage for the LVTSCR. Thus the ESD trigger voltage of the LVTSCR device is equivalent to a snap-back trigger voltage of the inserted short-channel NMOS transistor, which is typically much lower than a switching voltage of the original lateral SCR device. See A. Chatterjee, et al., "A Low-Voltage Triggering SCR for On-chip ESD Protection at Output and Input Pad," IEEE Electron Device Letters, Vol. 12, No. 1, January 1991, p. 21. However, the LVTSCR device can have a higher than desirable capacitance due to the usage of the NMOS transistor as the trigger device.

Several additional triggering arrangements are disclosed in M. P. J. Mergens et al., "Diode-Triggered SCR (DTSCR) for RF-ESD Protection of BiCMOS SiGe HBTs and CMOS Ultra-Thin Gate Oxides," IEEE (2003) and U.S. Pat. No. 6,850,397. These include a stack of diodes connected across the emitter and collector of the PNP transistor. The use of diode triggers, however, raises many issues in circuit design. Diodes have a very strong temperature dependence which could lead to different results at different temperatures. The diodes must be used in increments of one forward biased diode voltage drop which does not allow for fine tuning of the trigger voltage. The number of diodes used in a stack must be small enough to ensure that the SCR triggers before oxide breaks down at room temperature; but if the number of diodes used is too small, excessive leakage will occur under normal operation conditions at high temperatures.

SUMMARY OF INVENTION

The present invention is a trigger device useful, for example, in triggering an SCR in an ESD protection circuit. The trigger device is a MOSFET with a reverse biased diode integrated into the source. The device functions as a Zener diode with a trigger voltage determined by the threshold voltage of the MOS structure and the breakdown voltage of the source diode. Unlike conventional diode stacks, the trigger voltage can be adjusted over essentially a continuous range to meet ESD requirements and the device has much lower temperature dependence.

An illustrative embodiment of an NMOS trigger device comprises a gate and heavily doped P and N regions in a P-well on opposite sides of the gate. A first N type source/drain extension and a first P-type pocket region extend from the P region toward the N region with the pocket region located under the source/drain extension and extending under the gate. A second N-type source/drain extension and a second P-type pocket region extend from the N region toward the P region with the pocket region located under the source/drain extension and extending under the gate. The gate itself is heavily doped so that one half of the gate on the side adjacent the heavily doped P region is also heavily doped with dopants of P-type conductivity and the other half of the gate on the side adjacent the heavily doped N region is also heavily doped with dopants of N-type conductivity. Doping the gate increases the threshold voltage by about one Volt due to an increase in the work function on the source side of the gate.

Illustratively, the trigger device is formed by forming a P-well, growing an oxide layer and then forming a gate on the oxide layer. A P-type angled implant is then made in the regions under the edges of the gate, followed by an N-type implant. The N-type implant can be a standard lightly doped drain (LDD) implant. Since the gate masks the region of the P-well underneath the gate, the N-type implant is limited to the spaces on either side of the gate.

After the N-type implant, sidewalls are formed on the gate. A mask is then formed that exposes one half the gate along its width and the side of the P-well adjacent that half of the gate. A heavily doped P-type implant is then made in that half of the gate and adjacent portion of the P-well. This completes formation of the source side of the trigger device. Next, a mask is formed that exposes the other half of the gate and the other side of the P-well. A heavily doped N-type implant is then made in that half of the gate and the adjacent portion of the P-well. This completes formation of the drain side of the device. The P-type and N-type heavily doped implants can be standard source/drain implants.

In a typical application of the invention, many of the implant steps of the present invention are performed at the same time as implantation is carried out to form LDD regions and source/drain regions in other device structures in each of a large number of integrated circuit on a wafer.

The invention may also be practiced in an N-well to form a PMOS structure in which a first P-type source/drain extension and a first N-type pocket region extend form a heavily doped P region toward a heavily doped N-region with the pocket region located under the source/drain extension and extending under the gate and a second P-type source/drain extension and a second N-type pocket region extend from the heavily doped N region toward the heavily doped P region with the pocket region located under the source/drain extension and extending under the gate.

BRIEF DESCRIPTION OF DRAWING

These and other objects, features and advantages of the invention will be more readily apparent from the following Detailed Description in which.

DETAILED DESCRIPTION

Figure 1:
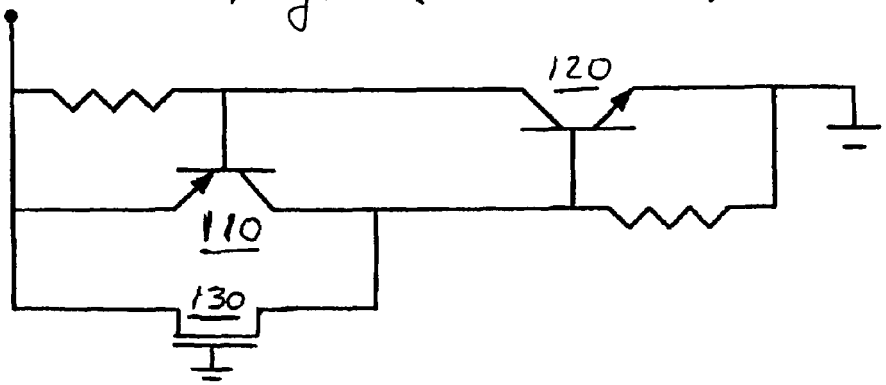
FIG. 1 is a schematic of an SCR structure with an NMOS trigger of the prior art.
Figure 2:
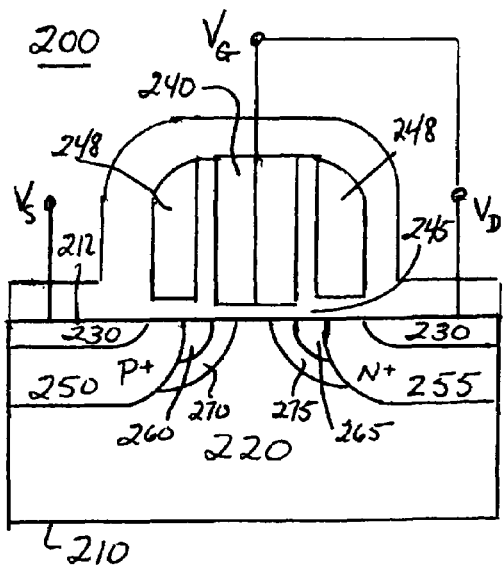
FIG. 2 is a cross-sectional view of a preferred NMOS trigger of the present invention.

As shown in FIG. 2, NMOS trigger device 200 comprises a P-well 220 in a substrate 210, silicide contacts 230, gate 240 and first and second heavily doped P and N regions 250, 255, respectively. Gate 240 is insulated from substrate 210 by a gate oxide 245 on an upper surface 212 of the substrate. The gate oxide includes sidewalls 248 on both sides of gate 240. A first N-type source/drain extension 260 and first P-type pocket region 270 extend from first region 250 toward second region 255 with the pocket region located under source/drain extension 260 and extending under gate 240. A second N-type source/drain extension 265 and second P-type pocket region 275 extend from second region 255 toward first region 250 with the pocket region located under source/drain extension 265 and extending under gate 240. Gate 240 is heavily doped so that one half of the gate on the side adjacent heavily doped P region 250 is also heavily doped with dopants of P-type conductivity and the other half of the gate on the side adjacent heavily doped N region 255 is also heavily doped with dopants of N-type conductivity. Doping the gate increases the threshold voltage by about one Volt due to an increase in the work function on the source side of the gate. Illustratively, the P-type dopant is boron and the N-type dopant is phosphorous, arsenic or antimony. The concentration of the P-type dopant in first heavily doped region 250 is in the range of approximately $1 \times 10^{20}$ to $5 \times 10^{20}$ atoms/cm$^3$ and in the pocket regions 270, 275 is in the range of approximately $1 \times 10^{18}$ to $1 \times 10^{19}$ atoms/cm$^3$. The concentration of the N-type dopant in second heavily doped region 255 is in the range of approximately $1 \times 10^{20}$ to $5 \times 10^{20}$ atoms/cm$^3$ and in source/drain extensions 260, 265 is in the range of approximately $1 \times 10^{19}$ to $1 \times 10^{20}$ atoms/cm$^3$.

Figure 3:
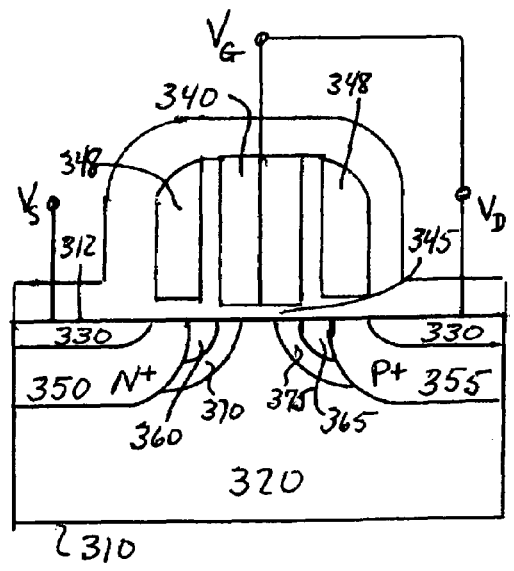
FIG. 3 is a cross-sectional view of a preferred PMOS trigger of the present invention.

As shown in FIG. 3, PMOS trigger device 300 comprises an N-well 320 in a substrate 310, silicide contacts 330, gate 340 and first and second heavily doped N and P regions 350, 355, respectively. Gate 340 is insulated from substrate 310 by a gate oxide 345 on an upper surface 312 of the substrate. The gate oxide includes sidewalls 348 on both sides of gate 340. A first P-type source/drain extension 360 and first N-type pocket region 370 extend from first region 350 toward second region 355 with the pocket region located under source/drain extension 360 and extending under gate 340 at upper surface 312 of the substrate. A second P-type source/drain extension 365 and second N-type pocket region 375 extend from second region 355 toward first region 350 with the pocket region located under source/drain extension 365 and extending under gate 340 at the upper surface 312 of the substrate. Gate 340 is heavily doped so that one half of the gate on the side adjacent heavily doped N region 350 is also heavily doped with dopants of N-type conductivity and the other half of the gate on the side adjacent heavily doped P region 355 is also heavily doped with dopants of P-type conductivity. Doping the gate increases the threshold voltage by about one Volt due to an increase in the work function on the source side of the gate. Illustratively, the P-type dopant is boron and the N-type dopant is phosphorous, arsenic or antimony. The concentration of the N-type dopant in first heavily doped region 350 is in the range of approximately $1 \times 10^{20}$ to $5 \times 10^{20}$ atoms/cm$^3$ and in the pocket regions 370, 375 is in the range of approximately $1 \times 10^{18}$ to $1 \times 10^{19}$ atoms/cm$^3$. The concentration of the P-type dopant in second heavily doped region 355 is in the range of approximately $1 \times 10^{20}$ to $5 \times 10^{20}$ atoms/cm$^3$ and in source/drain extensions 360, 365 is in the range of approximately $1 \times 10^{19}$ to $1 \times 10^{20}$ atoms/cm$^3$.

Both the NMOS and PMOS trigger devices have the advantages that the trigger voltage can be adjusted over essentially a continuous range to meet ESD requirements and the temperature dependence is much lower than that of conventional diodes. The trigger voltage is determined by the threshold voltage of the MOS structure and the breakdown voltage of the source diode. Both of these voltages can be adjusted. The threshold voltage of the MOS structure can be adjusted by using different threshold voltage implants. For example, low, standard and high threshold voltage implants are already available in conventional process technologies. Implants for intermediate threshold voltage levels can readily be developed by those skilled in the art. The breakdown voltage can also be adjusted by varying the doping of the source/drain extensions. For this purpose, low-voltage and high-voltage LDD implants are already available in conventional processes. Again, other doping levels can readily be developed. The temperature dependence is determined by the threshold voltage of the MOS structure and typically is less than 1 mV/° C.

Figure 4:
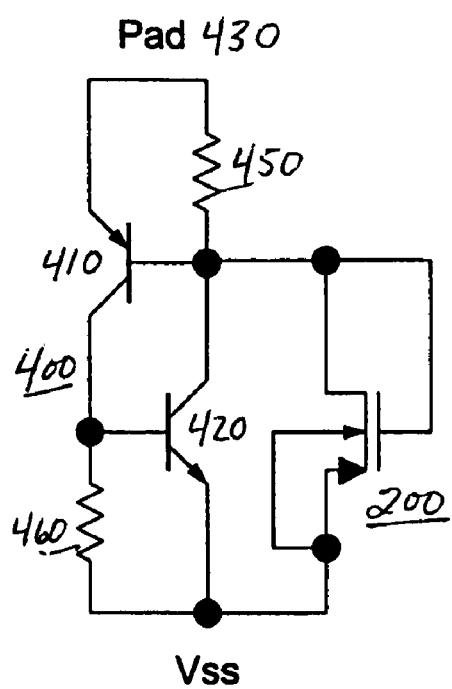
FIGS. 4 and 5 are schematic diagrams depicting the use of the NMOS and PMOS triggers of FIGS. 2 and 3 to trigger a semiconductor controlled rectifier (SCR)
Figure 5:
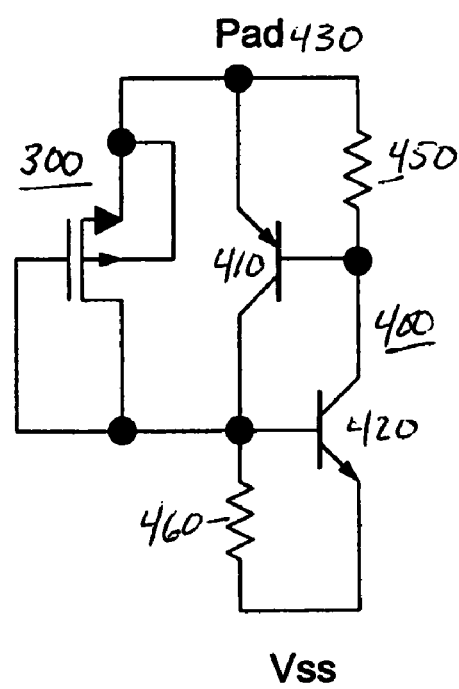

Circuit schematics illustrating the use of the NMOS and PMOS triggers 200 and 300 to trigger an SCR 400 are shown in FIGS. 4 and 5. In each of these Figs., SCR 400 comprises a PNP transistor 410 and an NPN transistor 420 with the collector of the PNP transistor connected to the base of the NPN transistor and the collector of the NPN transistor connected to the base of the PNP transistor. The emitter of PNP transistor 410 is connected to pad 430 and the emitter of NPN transistor 420 is connected to ground ($V_{ss}$). A first resistor 450 is connected between pad 430 and the base of PNP transistor 410 and a second resistor 460 is connected between the base of NPN transistor 420 and ground. As shown in FIG. 4, the source and drain of NMOS trigger device 200 are connected between the emitter of NPN transistor 420 and the base of PNP transistor 410. And as shown in FIG. 5, the source and drain of PMOS trigger device 300 are connected between the emitter of PNP transistor 410 and the base of NPN transistor 420.

Figure 6:
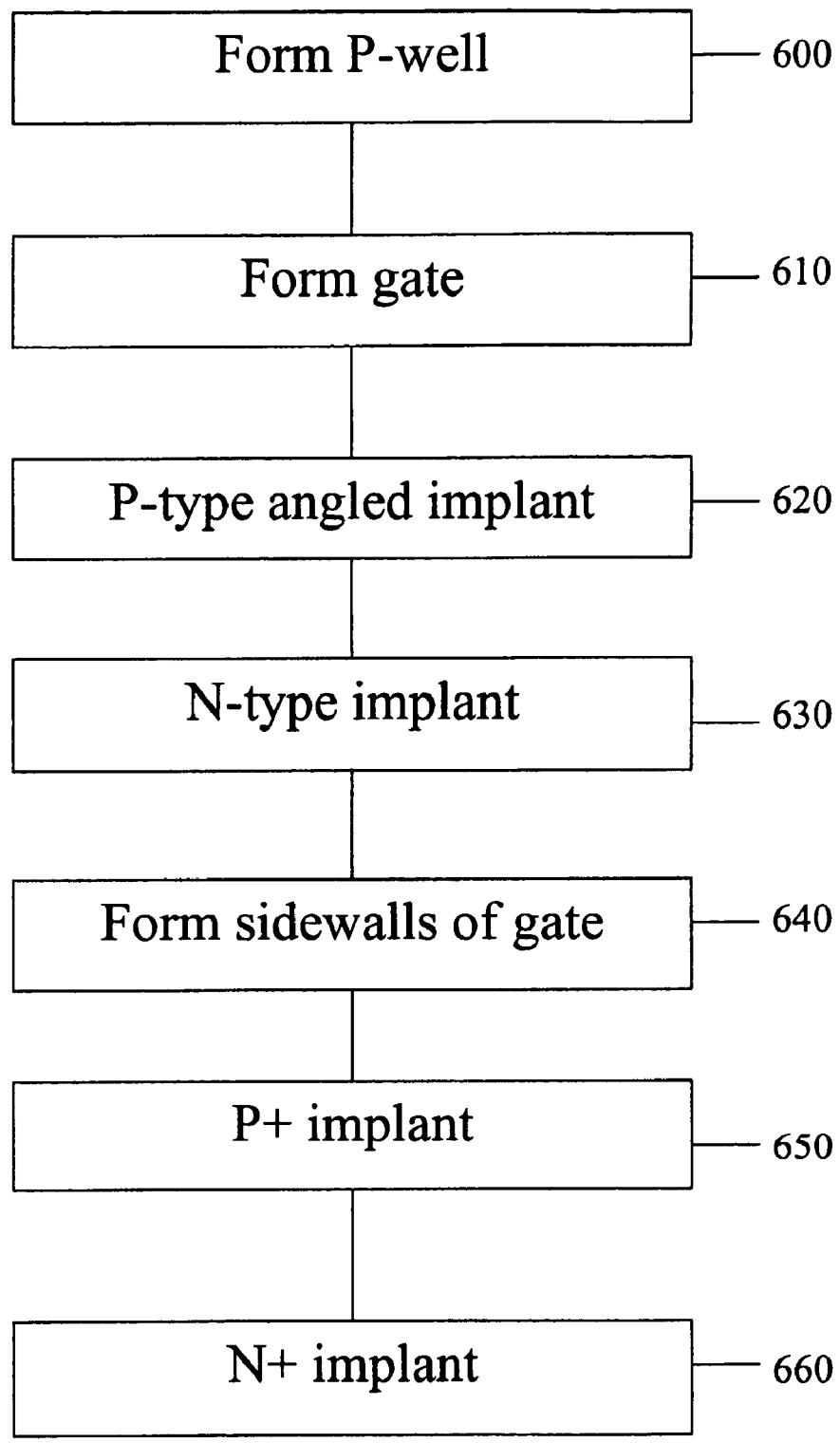
FIG. 6 is a flowchart depicting the process of making the embodiment of FIG. 2.

An illustrative method for forming device 200 is shown in the flow chart of FIG. 6. At step 600, P-well 220 is formed in substrate 210. An oxide layer is then formed on the surface of the substrate; and at step 610, a gate is formed on the oxide layer. These steps use conventional processes. At step 620, a P-type angled implant is made under the edges of the gate using conventional implantation processes. Illustrative implant energies are 5 to 50 keV.

At step 630, an N type implant is made using conventional processes for forming LDD regions. Illustrative implant energies are 1 to 30 keV. Since the gate masks the regions under the gate, the implant is limited to the spaces on either side of the gate.

After these implants, the sidewalls 248 of the gate are formed at step 640 using conventional techniques. The sidewalls can be made of silicon oxide, nitride, oxynitride or can be a multi-layer structure. A heavily doped P-type implant is then made at step 650 to form P+ region 250 and to dope approximately one half of the gate on the side nearer P+ region 250. To accomplish this, a mask is first formed on the other side of the gate and over region 255 where the N+ region is to be formed leaving exposed one half the gate and the portion of the P-well on that side of the gate. Ion implantation is then performed to implant P-type ions in region 250 and the longitudinal side of the gate closer to region 250. Illustrative implant energies are 2 to 30 keV.

A heavily doped N-type implant is then made at step 660 to form N+ region 255 and to dope approximately one half of the gate on the side nearer N+ region 255. To accomplish this, a mask is first formed on the other side of the gate and over region 250 where the P+ region has been formed leaving exposed one half the gate and the portion of the P-well on that side of the gate. Ion implantation is then performed to implant N-type ions in region 255 and the longitudinal side of the gate closer to region 255. Illustrative implant energies are 5 to 30 keV. Advantageously, the heavily doped P-type and N-type implants are made using conventional source/drain implants.

The steps for forming a PMOS trigger device 300 are the same as those set forth above for the formation of NMOS trigger device 200 but P-type dopants are substituted for N-type dopants and N-type dopants are substituted for P-type dopants.

As will be apparent to those skilled in the art, numerous variations may be employed in the practice of the invention. For example, changes may be made in the order of the process steps so that the angled implant is made after the LDD implant or the P+ implant is made after the N+ implant. The invention may also be adapted for use with numerous process technologies.

What is claimed is:

1. A trigger device for an electrostatic discharge (ESD) protection circuit, said device comprising:
    a substrate having a first conductivity type;
    a gate on the substrate and insulated therefrom, said gate having a width and first and second sides;
    a first heavily doped region in the substrate, said region extending for the width of the gate on its first side and having a first conductivity type;
    a second heavily doped region in the substrate, said region extending for the width of the gate on its second side and having a second conductivity type;
    a first source/drain extension in the substrate, said extension extending for the width of the gate and extending from the first heavily doped region toward the second heavily doped region and having a second conductivity type;
    a second source/drain extension in the substrate, said extension extending for the width of the gate and extending from the second heavily doped region toward the first heavily doped region and having a second conductivity type;
    a first pocket region located under the first source/drain extension and extending under the gate; and
    a second pocket region located under the second source/drain extension and extending under the gate, the first and second pocket regions having a first conductivity type.

2. The trigger device of claim 1 wherein the gate is doped with dopants of the first conductivity type on a first side closer to the first heavily doped region and is doped with dopants of the second conductivity type on a second side closer to the second heavily doped region.

3. The trigger device of claim 1 wherein the first conductivity type is P-type conductivity and the second conductivity type is N-type conductivity.

4. The trigger device of claim 1 wherein the first conductivity type is N-type conductivity and the second conductivity type is P-type conductivity.

5. The trigger device of claim 1 wherein the first conductivity type is P-type conductivity and the second conductivity type is N-type conductivity.

6. The trigger device of claim 1 wherein the first conductivity type is N-type conductivity and the second conductivity type is P-type conductivity.

7. The trigger device of claim 1 further comprising silicide contact regions contacting the first and second heavily doped regions.

8. An electrostatic discharge (ESD) protection circuit comprising:
    a PNP transistor and an NPN transistor, each having an emitter, a base and a collector, with the collector of the PNP transistor connected to the base of the NPN transistor and the collector of the NPN transistor connected to the base of the PNP transistor, and
    a trigger device connected between the emitter of one of the transistors and the base of the other transistor wherein the trigger device comprises:
    a substrate having a first conductivity type;
    a gate on the substrate and insulated therefrom, said gate having a width and first and second sides;
    a first heavily doped region in the substrate, said region extending for the width of the gate on its first side and having a first conductivity type;
    a second heavily doped region in the substrate, said region extending for the width of the gate on its second side and having a second conductivity type;
    a first source/drain extension in the substrate, said extension extending for the width of the gate and extending from the first heavily doped region toward the second heavily doped region and having a second conductivity type;
    a second source/drain extension in the substrate, said extension extending for the width of the gate and extending from the second heavily doped region toward the first heavily doped region and having a second conductivity type;
    a first pocket region located under the first source/drain extension and extending under the gate; and
    a second pocket region located under the second source/drain extension and extending under the gate, the first and second pocket regions having a first conductivity type.

9. The ESD protection circuit of claim 8 wherein the gate of the trigger device is doped with dopants of the first conductivity type on a first side closer to the first heavily doped region and is doped with dopants of the second conductivity type on a second side closer to the second heavily doped region.

10. The ESD protection circuit of claim 8 wherein the first conductivity type is P-type conductivity and the second conductivity type is N-type conductivity and the trigger device is connected between the emitter of the NPN transistor and the base of the PNP transistor.

11. The ESD protection circuit of claim 8 wherein the first conductivity type is N-type conductivity and the second conductivity type is P-type conductivity and the trigger device is connected between the emitter of the PNP transistor and the base of the NPN transistor.

12. The ESD protection device of claim 8 wherein the first conductivity type is P-type conductivity and the second conductivity type is N-type conductivity.

13. The ESD protection device of claim 8 wherein the first conductivity type is N-type conductivity and the second conductivity type is P-type conductivity.

* * * * *